United States Patent [19]

Miyatake

[11] Patent Number: 4,851,890
[45] Date of Patent: Jul. 25, 1989

[54] SOLID-STATE IMAGE SENSOR
[75] Inventor: Shigehiro Miyatake, Osaka, Japan
[73] Assignee: Sharp Kabushiki Kaisha, Osaka, Japan
[21] Appl. No.: 903,503
[22] Filed: Sep. 4, 1986
[30] Foreign Application Priority Data
    Nov. 25, 1985 [JP] Japan .................. 60-266759
[51] Int. Cl.[4] .......................................... H01L 29/78
[52] U.S. Cl. ................................................... 357/24
[58] Field of Search ........................................ 357/24
[56] References Cited
    U.S. PATENT DOCUMENTS
    4,498,013  2/1985  Kuroda et al. ................. 250/578
    FOREIGN PATENT DOCUMENTS
    0173542  3/1986  European Pat. Off. .
    OTHER PUBLICATIONS
"An Interline CCD Image Sensor with Reduced Image Lag", 8093 IEEE Transactions on Electron Devices, ED-31 (1984) Dec., No. 12, New York, USA.
"A 580×500 Element CCD Imager with a Shallow Flat P Well", 8172 IEEE International Solid-State Circuits Conference, 28 (1985) Feb., 32nd Conf., Coral Gables, Fla., USA.

Primary Examiner—Robert S. Macon
Attorney, Agent, or Firm—Birch, Stewart, Kolasch, & Birch

[57] ABSTRACT

A solid-state image sensor having a plurality of unit cells, each of which comprises a photosensitive area and a CCD register for the transfer of a signal charge generated in the photosensitive area. Both the photosensitive area and the CCD register are disposed on a first layer, having different polarities than the charging polarity of the signal charge, which is disposed on a substrate having the same polarity as the signal charge. The CCD register is underlaid by a second layer having the same polarity as the first layer and the second layer contains a higher impurity concentration than the first layer.

12 Claims, 2 Drawing Sheets

SOLID-STATE IMAGE SENSOR

BACKGROUND OF THE INVENTION

1. Field of the Invention

This invention relates to a solid-state image sensor, particularly an interline CCD image sensor (i.e., an interline-transfer charge-coupled device image sensor), which can be made compact and which can suppress both blooming and smear.

2. Description of the Prior Art

Although solid-state image sensors are advantageous over pick-up tubes by the compactness, minimization of weight, durability, reliability, etc., of the solid-state image sensors. Moreover, the solid-state image sensors exhibit no burn-in from intense overloads, but they give rise to blooming and smear which do not arise in pick-up tubes. Blooming occurs when excess signal charges in the photodiode overflow into the transfer channel, so that distinct white lines result on the obtained image. While smear takes places when a signal charge generated deep inside the substrate diffuses into the transfer channel, so that indistinct white lines result on the obtained image. Blooming can be eliminated by the use of overflow drains composed of an n+-diffusion layer which absorbs excess charges. However, the problem of smear has not yet been solved.

The above-mentioned approach for the elimination of blooming sacrifices photosensitivity and dynamic range of the sensor because the active area is reduced, and accordingly a method for the transfer of the excess charges into the substrate has been proposed by Y. Ishihara et al., "Interline CCD Image Sensor with an Antiblooming Structure", IEEE Transactions on Electron Devices, vol. ED-31, No. 1, January 1984. FIG. 3 shows a unit cell of the interline CCD image sensor described in the above-mentioned article, wherein an n⁻-layer 3 constituting a buried channel of the vertical CCD register is formed on a thick p-type layer 13, and an n-type layer 14 constituting a p-n junction photodiode as a photosensitive area is formed on a thin p-type layer 12. Both the thick p-type layer 13 and the thin p-type layer 12 are positioned on an n-type substrate 1. A transfer gate region 7 positioned between the n⁻-layer 3 and the n-type layer 14 contains the part of the p-type layer which has not undergone a depletion. This unit cell is electrically isolated from adjacent unit cells by channel stops 6 that are composed of p+-layers formed in the surroundings thereof. On the n⁻-layer 3 and the transfer gate region 7, a polysilicon electrode 9 is formed, which is an electrode for the vertical CCD register to be driven by pulses $\phi v$ that are fed to the electrode 9. An Al film 10 is further formed as a photo-shield on the polysilicon electrode 9.

A reverse bias voltage is applied between the channel stops 6 and the n-type substrate 1, and a complete depletion of the thin p-type layer 12 results.

The pulses $\phi v$ have three levels, $V_H$(high), $V_M$(middle) and $V_L$ (low). When the pulses $\phi v$ are between the $V_M$ and $V_L$ levels, the n⁻-layer 3, which constitutes the vertical CCD register area, is isolated from the n-type layer 14, which constitutes the photosensitive area, by the transfer gate region 7 containing a part of the p-type layer. When the pulses $\phi v$ are at the highest potential $V_H$, a signal charge is accumulated in the photosensitive area and transferred from the photosensitive area into the vertical CCD register area through the transfer gate region 7, and the potential of the n-type layer 14, which constitutes the photosensitive area, results in a level equal to the surface potential of the transfer gate region 7. This signal charge is further transferred to a horizontal CCD register (not shown) and read out at a gated charge detector (not shown).

As the photogenerated signal charge is accumulated into the n-type layer 14, the potential of the n-type layer 14 decreases. The excess charges generated in the n-type layer 14 receives intense illumination thereto and are transferred from the n-type layer 14 into the n-type substrate 1 through the thin p-type layer 12 which has been depleted. As a result, blooming is suppressed.

As mentioned above, the conventional image sensor shown in FIG. 3 can suppress blooming, but it still has the following serious problems:

The first problem is that the image sensor cannot be made compact because of the transverse expansion of the thick p-type layer 13. The size of the unit cell cannot be minimized beyond the thickness of the thick p-type layer 13 in the transverse direction because the size of the thick p-type layer 13 is essential to the operation of the unit cell.

The second problem is that smear unavoidably takes place when a signal charge is generated in the non-depleted thick p-type layer 13 and diffuses into the vertical CCD register so that the signal charges are mixed in the vertical CCD register.

In order to eliminate these problems, the inventors of this invention have proposed a solid-state image sensor having a plurality of unit cells in U.S. patent application Ser. No. 770,043, wherein each of the unit cells comprises a photosensitive area and a CCD register for transferring a signal charge generated in said photosensitive area. Both the photosensitive area and the CCD register are disposed on a layer and have different polarities than the charging polarity of the signal charge, which is disposed on a substrate having the same polarity as the signal charge. The photosensitive area has the same polarity as said signal charge, and a suppression of blooming results.

FIG. 4 shows a unit cell of the interline CCD image sensor of the above-mentioned U.S. patent application. This unit cell comprises an n-type substrate 21, a p-type layer 22 formed on the n-type substrate 21, a vertical CCD register composed of a buried channel constituted by an n⁻-layer 23 and formed on the p-type layer 22, and a photosensitive area which containing a p-n junction photodiode constituted by an n⁻-layer 24 and an n+-layer 25.

A transfer gate region 27 containing a part of the p-type layer is positioned between the n⁻-layer 23 and the n+-layer 25. This unit cell is isolated from adjacent unit cells by channel stops 26 composed of p+-layers formed in the surroundings thereof. On the n⁻-layer 23 and the transfer gate region 27, the polysilicon electrode 29 functioning as an electrode for the CCD register is driven by pulses $\phi v$ fed to the electrode 29 and is disposed through an insulating film 28 to the n-type layer and the transfer gate region 27. An Al film 30 is disposed as a photo-shield on the polysilicon electrode 29.

A reverse bias voltage is applied between the channel stop 26 and the n-type substrate 21. A complete depletion not only in the region of the p-type layer positioned between the substrate 21 and the CCD register, but also in the region of the p-type layer positioned between the substrate 21 and the photodiode area.

The introduction of the pulses φv (having three potential levels, $V_H$, $V_M$, and $V_L$) into the polysilicon electrode of the image sensor of this invention having the above-mentioned structure, the reading out of a signal charge at a gate transfer detector, the control of the transfer of the signal charge into the CCD register, and the control of the accumulation of the signal charge in the photosensitive area are attained in the same manner as for a conventional image sensor. Because the region of the p-type layer positioned below the photodiode area has been depleted, excess charges are generated in the photodiode area that receive intense illumination and are transferred from the photodiode area into the n-type substrate 21 through the $n^-$-layer 24 and the p-type layer 22 in the same manner as the conventional image sensor in FIG. 3, and a suppression of blooming results. Due to the above-mentioned structure of the image sensor, the region of the p-type layer 22 positioned below the $n^-$-layer 23 is also depleted and charges are generated deep inside the region that may be transferred into the n-type substrate 21 without the charges diffusing into the CCD register, so that smear can be completely suppressed. Moreover, the transverse expansion of the thick p-type layer that is required in a conventional image sensor is not required in above-mentioned image sensor, so that the image sensor can be made compact.

However, the unit cell shown in FIG. 4 is designed so that the buried channel CCD register and the photosensitive area are disposed on the same p-type well. The following problem is caused as a result: When a reverse bias voltage is applied between the n-type substrate 21 and the p-type well 22 at a low level, electrons are injected from the n-type substrate 21 into the buried channel CCD register 23 through the p-type well 22 formed on the n-type substrate 21 (S. Miyatake et al., "A CCD Imager on Three Types of P-Wells", Jpn. J. Appl. Phys., vol. 24, pp. 574–579, May 1985), and electrons result in being injected into the CCD register. As the impurity concentration of the p-type well 22 becomes lower, the injection voltage of the CCD register becomes higher. Thus, in order to suppress such an injection of electrons, the impurity concentration of the p-type well 22 must be set at a high level. When the impurity concentration of the p-type well 22 is set too high, excess charges are generated in the photosensitive area that receive intense illumination and cannot be transferred from the photosensitive area into the n-type substrate 21 through the p-type well 22, which causes blooming. As mentioned above, the proposed structure of a unit cell of the interline CCD image sensor attains a suppression of smear and a compact structure, but the impurity concentration of the p-type well 22 must be set so that excess charges in the photodiode area overflow into the n-type substrate 21 through the p-type well 22. Therefore, electrons are not injected from the n-type substrate 21 into the buried channel CCD register 23, and the impurity concentration of the p-type well 22 is not limited.

SUMMARY OF THE INVENTION

The solid-state image sensor of this invention overcomes the above-discussed and numerous other disadvantages and deficiencies of the prior art. The solid-state image sensor of this invention has a plurality of unit cells, each of which comprises a photosensitive area and a CCD register for the transfer of a signal charge generated in the photosensitive area. Wherein both the photosensitive area and the CCD register are disposed on a first layer, having different polarities from the charging polarity of the signal charge, and are disposed on a substrate having the same polarity as the signal charge. The CCD register is underlaid by a second layer having the same polarity as the first layer and contains a higher impurity concentration than that of the first layer.

The photosensitive area has, in a preferred embodiment, the same polarity as the signal charge. The impurity concentration of the outer surface region of the photosensitive area is, in a preferred embodiment, higher than that in the region of the photosensitive area facing the substrate. The outer surface region of the photosensitive area is, in a preferred embodiment, formed by a self-alignment technique using an electrode as a mask for the CCD register.

The outer surface region of the photosensitive area contains, in a preferred embodiment, a layer having a different polarity than the charging polarity of the signal charge and the region of the photosensitive area facing the substrate contains a layer having the same polarity as the signal charge.

Depletion is, in a preferred embodiment, attained not only in the region between the substrate and the photosensitive area but also in the region between the substrate and the CCD register by the application of a reverse bias voltage between the substrate and the layer formed on the substrate.

The CCD register is, in a preferred embodiment, composed of a buried channel. In a preferred embodiment, the impurity concentration in the outer surface of the photosensitive area is higher than that in the region of the photosensitive area facing the substrate. Moreover, the formation of the inner layer of the photosensitive area facing the substrate is formed simultaneously with the buried channel of the CCD register.

Thus, the invention described herein makes possible the objects of (1) providing a solid-state image sensor which achieves a suppression of not only blooming but also smear; (2) providing a solid-state image sensor which has a compact structure; and (3) providing a solid-state image sensor which has the impurity concentration of the p-type well set at a selected level on which the photosensitive area and the buried channel CCD register are disposed, so that various limitations in the design and the production of the sensor can be loosened. Thereby, an efficient production of the sensor is attained.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
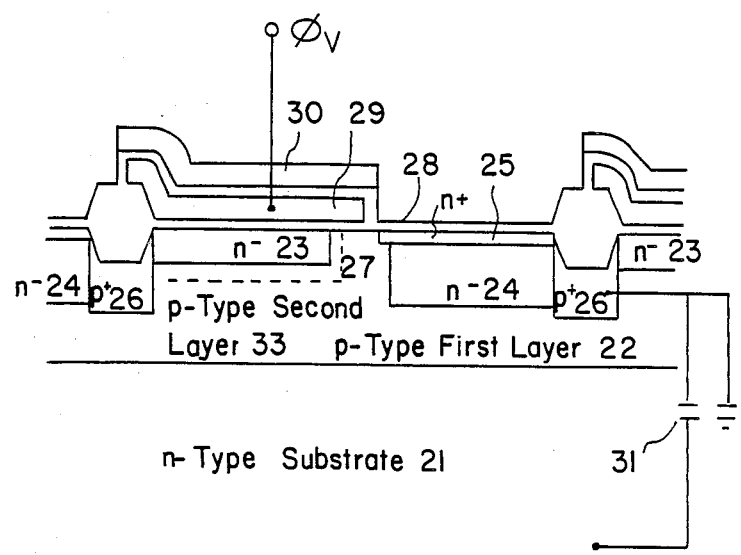
FIG. 1 is a sectional view showing a unit cell of the solid-state image sensor of this invention.

FIG. 1 shows a unit cell of the interline CCD image sensor of this invention. The interline CCD image sensor comprises an n-type substrate 21, a p-type first layer 22 formed on the n-type substrate 21, a vertical CCD register which is composed of a buried channel constituted by an $n^{--}$-layer 23 formed on the p-type layer 22, and a photosensitive area which contains a p-n junction photodiode constituted by an $n^{--}$-layer 24 and an $n^{+}$-layer 25. The $n^{--}$-layer 23 is underlaid by a p-type second layer 33, and the impurity concentration of the p-type second layer 33 is higher than that of the p-type first layer 22. The $n^{+}$-layer 25 is positioned in an outer surface region of the photosensitive area, while the $n^{--}$-layer 24 is positioned in the region of the photosensitive area facing the n-type substrate 21. Because the $n^{+}$-layer 25 can be formed by a self-alignment technique using a polysili-, a polysilicon electrode 29 as a mask for the CCD register, the production process of this image sensor is simplified. Moreover, since the $n^{--}$-layer 24 can be formed at the same time as the $n^{--}$-layer 23 constituting the buried channel, the production processes of this image sensor is further simplified.

Alternatively a thick $n^{+}$-layer 25 can be disposed alone without the $n^{--}$-layer 24. Although the resulting image sensor is inferior in photosensitivity to short wavelengths, because the thick $n^{+}$-layer 25 contains a high impurity concentration.

A transfer gate region 27 containing a part of the p-type layer is positioned between the $n^{--}$-layer 23 and the $n^{+}$-layer 25. This unit cell is isolated from adjacent unit cells by channel stops 26 composed of $p^{+}$-layers formed in the surroundings thereof. The polysilicon electrode 29 functions as an electrode for the CCD register and is driven by pulses $\phi v$ fed to the electrode 29 to be disposed through an insulating film 28 to the $n^{--}$-layer and the transfer gate region 27. On the polysilicon elec An Al film 30 is disposed as a photoshield for the polysilicon electrode 29.

A reverse bias voltage is applied between the channel stop 26 and the n-type substrate 21. A complete depletion not only in the region of the p-type layer positioned between the substrate 21 and the CCD register, but also in the region of the p-type layer positioned between the substrate 21 and the photodiode area results.

The introduction of the pulses $\phi v$ (having three potential levels, $V_H$, $V_M$, and $V_L$) into the polysilicon electrode of the image sensor of this invention having the above-mentioned structure, the reading out of a signal charge at a gate transfer detector, the control of the transfer of the signal charge into the CCD register, and the control of the accumulation of the signal charge in the photosensitive area are attained in the same manner as for a conventional image sensor. Because the region of the p-type layer positioned below the photodiode area has been depleted, excess charges generated in the photodiode area receive intense illumination and are transferred from the photodiode area into the n-type substrate 21 through the $n^{--}$-layer 24 and the p-type layer 22 in the same manner as the conventional image sensor of FIG. 3, with a suppression of blooming as a result. Moreover, because the $n^{--}$-layer 23 constituting the buried channel CCD register is underlaid by the p-type layer 33, when the p-type layer 33 contains a high impurity concentration, the injection of electrons from the n-type substrate 21 into the buried channel CCD register 23 can be easily prevented. The region of the p-type layer 22 positioned below the $n^{--}$-layer 23 is also depleted and charges that are generated deep inside the region can be transferred from the region into the n-type substrate 21 without diffusion of the charges into the CCD register, so that smear can be completely suppressed. Moreover, the transverse expansion of the thick p-type layer that is required in a conventional image sensor is not required in above-mentioned image sensor of this invention, so that the image sensor can be made compact.

Example 2

Figure 2:
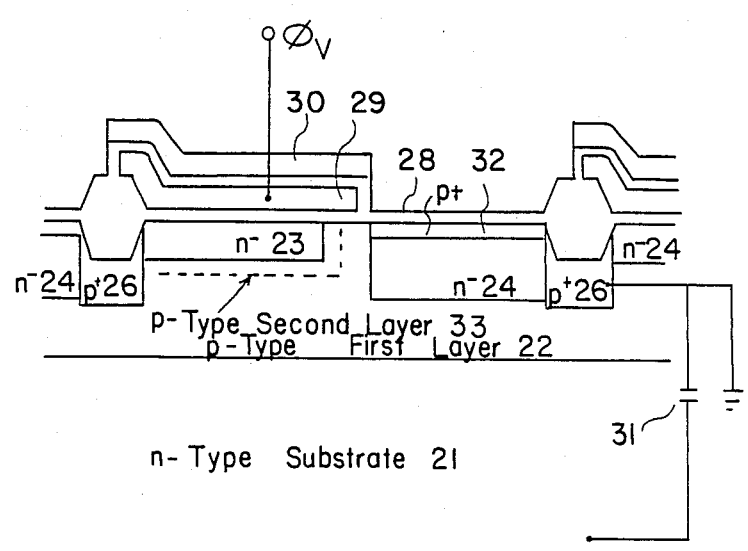
FIG. 2 is a sectional view showing another unit cell of the solid-state image sensor of this invention.

FIG. 2 shows another unit cell of the interline CCD image sensor of this invention, which has the same structure as the unit cell of the image sensor shown in FIG. 1, except that a $p^{+}$-layer 32 is employed instead of the $n^{+}$-layer 25 which constitutes the the outer surface region of the photosensitive area. This image sensor shown in FIG. 2 operates in the same manner and attains the same effects as the unit cell shown in FIG. 1, except that when the pulses $\phi v$ are at the highest potential level $V_H$ and the signal charge accumulated in the photosensitive area is read out at the horizontal CCD register, the $n^{--}$-layer 24 must be completely depleted because the $p^{+}$-layer 32 is formed with a high impurity concentration and positioned at the same potential as the $p^{+}$-channel stop layer 26.

As mentioned above, each of the unit cells of the image sensor according to this invention is designed in a manner to form both the buried channel CCD register of the $n^{--}$-layer constituting the transfer area and the photodiode constituting the photosensitive area on the same p-type layer disposed on the n-type substrate. Therefore, excess charges are generated in the photodiode that receive intense illumination and can be transferred from the photodiode into the n-type substrate through the depleted region of the p-type layer therebetween, with a suppression of blooming as a result. Moreover, the impurity concentration of the p-type layer positioned below the buried channel CCD register can be set at a higher level than that of the p-type layer positioned below the photodiode, when excess charges in the photodiode overflow into the n-type substrate 21 through the p-type well 22 and electrons are not injected from the n-type substrate 21 into the buried channel CCD register 23. Moreover, because the photodiode area and the CCD register are formed on the thin p-type well, the region of the p-type well positioned below the CCD register can be depleted and charges that are generated deep inside the depleted region of the p-type well do not diffuse into the CCD register, with a suppression of smear as a result.

Figure 3:
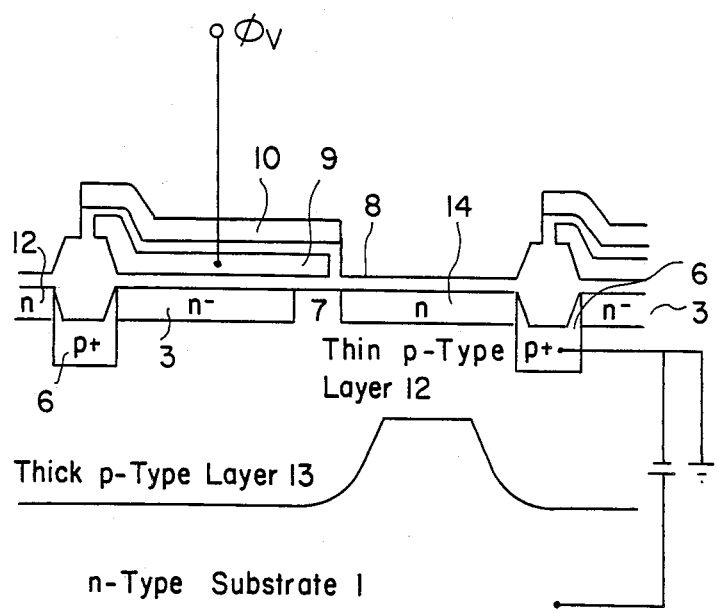
FIG. 3 is a sectional view showing a conventional unit cell of the interline CCD image sensor.
Figure 4:
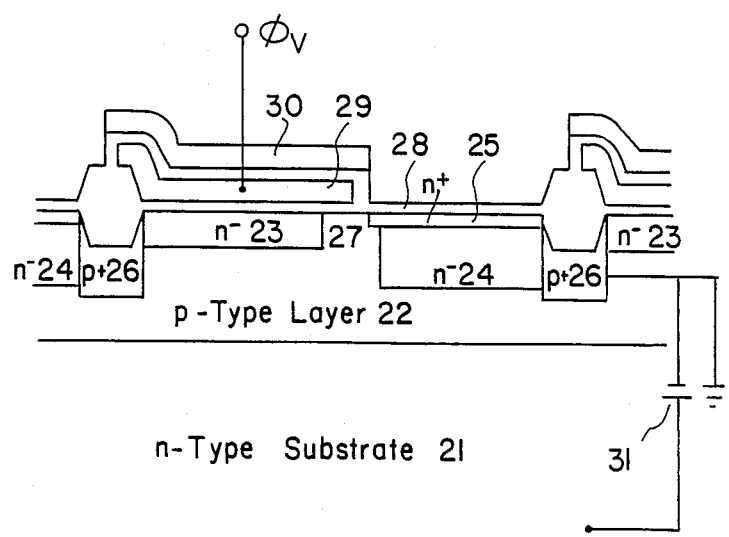
FIG. 4 is a sectional view showing another conventional unit cell of the interline CCD image sensor.

Because the image sensor of this invention has only one p-type layer 22, on which both the CCD register and the photodiode are formed, and does not have a thick p-type layer 13 expanding transversely as in the conventional image sensor in FIG. 3, the image sensor can be made compact. The conventional image sensor cannot be made compact because of the transverse expansion of the thick p-type layer 13.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A solid-state image sensor comprising:
    a substrate having a first charge polarity;
    a plurality of unit cells formed on a substrate, each said unit cell including;
        a first layer disposed on said substrate having a second charge polarity opposite to said first charge polarity and a first impurity concentration;
        a second smear preventing layer disposed on a portion of said first layer having said second charge polarity and a second impurity concentration greater than said first impurity concentration;
        a CCD register element disposed on said second smear preventing layer; and
        a photosensitive area disposed on a portion of said first layer adjacent to said CCD register element;
    said second smear preventing layer preventing the occurrence of smear when signal charges are transferred from said photosensitive area to said CCD register element of each unit cell.

2. A solid-state image sensor according to claim 1, wherein said photosensitive area further comprises:
    a first region disposed on said first layer having said first charge polarity; and
    a second region disposed on sid first region having said first charge polarity.

3. A solid-state image sensor according to claim 2, wherein the impurity concentration of the second region of said photosensitive area is higher than the impurity concentration in the first region of said photosensitive area.

4. A solid-state image sensor according to claim 1, wherein said photosensitive area further comprises:
    a first region disposed on said first layer having said first charge polarity; and
    a second disposed on said first region region having said second charge polarity.

5. A solid-state image sensor according to claim 1, wherein depletion regions are attained in a first depletion region of said first layer positioned directly below said photosensitive area and in a second depletion region of said first layer positioned directly below said CCD register element when a reverse bias voltage is applied between said substrate and said first layer.

6. A solid-state image sensor according to claim 1, wherein said CCD register element is composed of a buried channel layer.

7. A solid-state image sensor according to claim 3, wherein edges of the second region of said photosensitive area are defined by an electrode of said CCD register element through use of through use of a self-alignment mask technique using the electrode of said CCD register element as a mask.

8. A solid-state image sensor according to claim 6, wherein the impurity concentration in said second region of said photosensitive area is higher than in the first layer of said photosensitive area, and said first region of said photosensitive area is formed simultaneously with said buried channel layer of the CCD register element.

9. A solid-state image sensor comprising:
    a substrate having a first charge polarity;
    a plurality of unit cells formed on a substrate, each said unit cell including;
        a first blooming suppression layer disposed on said substrate having a second charge polarity opposite to said first charge polarity and a first impurity concentration;
        a second smear preventing layer disposed on a portion of said first blooming suppression layer having said second charge polarity and a second impurity concentration greater than said first impurity concentration;
        a CCD register element disposed on said second smear preventing layer; and
        a photosensitive area disposed on a portion of said first blooming suppression layer adjacent to said CCD register element;
    said first blooming suppression layer preventing signal charges generated in said photosensitive area from being transferred to said substrate and said second smear preventing layer prevents the occurrence of smear when signal charges are transferred from said photosensitive area to said CCD register element of each unit cell.

10. A solid-state image sensor according to claim 9, wherein said photosensitive area further comprises:
    a first region disposed on said first blooming suppression layer having said first charge polarity; and
    a second region disposed on said first region having said first charge polarity.

11. A solid-state image sensor according to claim 9, wherein said photosensitive area further comprises;
    a first region disposed on said first blooming suppression layer having said first charge polarity; and
    a second region disposed on said first region having said second charge polarity.

12. A method of producing a solid-state image sensor, comprising the steps of:
    forming a substrate;
    forming a plurality of unit cells on said substrates by,
        disposing a first layer on said substrate;
        forming a second smear preventing layer on a portion of said first layer,
        successively forming a CCD register element on said second smear preventing layer and a photosensitive area on said first layer adjacent to said CCD register element,
        selectively forming a CCD register electrode substantially over said CCD register element, and
        forming a second region substantially over said photosensitive area by a self-alignment masking process using said CCD register electrode as a mask.

* * * * *